(12) United States Patent
Yasuda

(10) Patent No.: US 10,886,897 B2
(45) Date of Patent: Jan. 5, 2021

(54) FILTER DEVICE AND FILTER MODULE

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/438,511

(22) Filed: Jun. 12, 2019

(65) Prior Publication Data

US 2019/0296717 A1 Sep. 26, 2019

Related U.S. Application Data

(63) Continuation of application No. PCT/JP2017/044475, filed on Dec. 12, 2017.

(30) Foreign Application Priority Data

Dec. 26, 2016 (JP) .................................. 2016-251337

(51) Int. Cl.
*H03H 9/72* (2006.01)
*H03H 9/02* (2006.01)
*H03H 9/64* (2006.01)

(52) U.S. Cl.
CPC .......... *H03H 9/72* (2013.01); *H03H 9/02913* (2013.01); *H03H 9/64* (2013.01); *H03H 9/6483* (2013.01); *H03H 9/6489* (2013.01)

(58) Field of Classification Search
CPC ........ H03H 9/72; H03H 9/02913; H03H 9/64; H03H 9/6483; H03H 9/6489

(Continued)

(56) References Cited

U.S. PATENT DOCUMENTS 4,733,122 A 3/1988 Shinonaga et al.
2004/0116098 A1 6/2004 Ochii et al.
(Continued)

FOREIGN PATENT DOCUMENTS

JP 62-105514 A 5/1987
JP 2004-194240 A 7/2004
(Continued)

OTHER PUBLICATIONS

Official Communication issued in International Patent Application No. PCT/JP2017/044475, dated Mar. 6, 2018.
(Continued)

*Primary Examiner* — Benny T Lee
*Assistant Examiner* — Hafizur Rahman
(74) *Attorney, Agent, or Firm* — Keating & Bennett, LLP

(57) ABSTRACT

A filter device includes a substrate and first to third filters provided on the substrate and each including an input terminal and an output terminal. A center frequency of a pass band of the first filter is lower than a center frequency of a pass band of the second filter, and the center frequency of the pass band of the second filter is lower than a center frequency of a pass band of the third filter. Of the first and third filters, when the filter having the center frequency of the pass band close to the center frequency of the filter is defined as a proximity filter and the other is defined as a non-proximity filter, an input terminal and an output terminal of the proximity filter are not adjacent to an input terminal and an output terminal of the second filter.

21 Claims, 8 Drawing Sheets

(58) Field of Classification Search
USPC .......................................................... 333/133
See application file for complete search history.

(56) References Cited

U.S. PATENT DOCUMENTS

| | | | |
|---|---|---|---|
| 2013/0307749 A1 | 11/2013 | Nagai | |
| 2015/0295697 A1* | 10/2015 | Kawachi | ............... H03H 9/706 |
| | | | 370/276 |

FOREIGN PATENT DOCUMENTS

| | | |
|---|---|---|
| JP | 2006-014102 A | 1/2006 |
| JP | 2005-057342 A | 3/2006 |
| JP | 3147878 U | 1/2009 |
| WO | 2012/105302 A1 | 8/2012 |

OTHER PUBLICATIONS

Official Communication issued in corresponding Japanese Patent Application No. 2018-559000, dated Jul. 7, 2020.

* cited by examiner

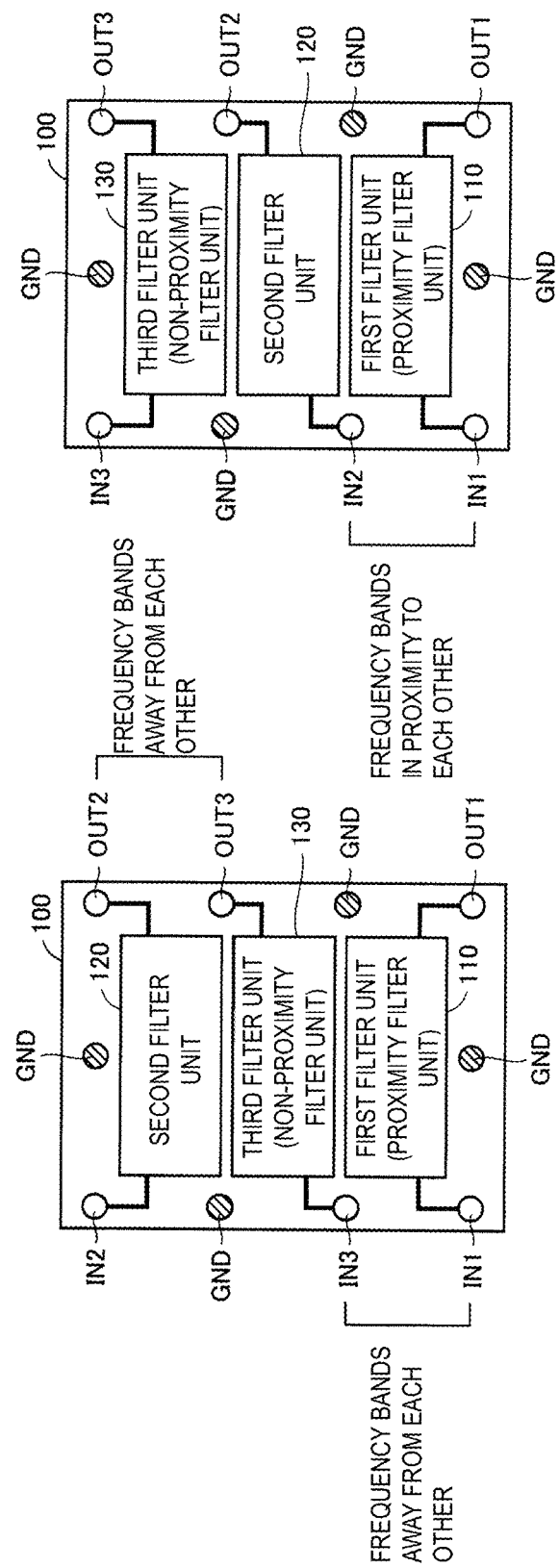

FILTER DEVICE AND FILTER MODULE

CROSS REFERENCE TO RELATED APPLICATIONS

This application claims the benefit of priority to Japanese Patent Application No. 2016-251337 filed on Dec. 26, 2016 and is a Continuation Application of PCT Application No. PCT/JP2017/044475 filed on Dec. 12, 2017. The entire contents of each application are hereby incorporated herein by reference.

BACKGROUND OF THE INVENTION

1. Field of the Invention

The present invention relates to a filter device and a filter module, and more particularly, to a filter module in which three or more filter devices are provided on the same substrate.

2. Description of the Related Art

In recent years, development of a wireless terminal corresponding to signals in a plurality of frequency bands, i.e., a multi-band wireless terminal (for example, a cellular phone or a smartphone), has progressed. In such a wireless terminal, it is necessary to include a plurality of filters adapted to the frequency to be used, and it is also necessary to reduce the size of the filter due to the limitation of the size of the product.

Japanese Unexamined Patent Application Publication No. 2005-57342 discloses a triplexer having a structure in which three surfaces acoustic wave (SAW) filters having different frequency bands are arranged on one substrate to achieve miniaturization of a multi-band wireless terminal device.

In a case in which a plurality of filters having different frequency bands are arranged on the same substrate as in Japanese Unexamined Patent Application Publication No. 2005-57342, when filters having frequency bands in proximity to each other are arranged adjacent to each other, the signals passing through the filters interfere with each other, so that isolation between the lines may not be sufficiently ensured. Then, insertion loss characteristics of the filter are deteriorated, and a desired performance may not be achieved.

SUMMARY OF THE INVENTION

Preferred embodiments of the present invention reduce or prevent deterioration in insertion loss characteristics of each filter of filter devices in which a plurality of filters having different frequency bands are provided on the same substrate.

A filter device according to a preferred embodiment of the present invention includes a substrate and at least first, second, and third filters provided on the substrate and each including an input terminal and an output terminal. The first, second, and third filters are capable of passing signals in first, second, and third frequency bands, respectively, a center frequency of the first frequency band is lower than a center frequency of the second frequency band, and the center frequency of the second frequency band is lower than a center frequency of the third frequency band. Of the first and third filters, when the filter having a frequency band in which a center frequency of a passable frequency band is closer to the center frequency of the second frequency band is defined as a proximity filter and another is defined as a non-proximity filter, an input terminal and an output terminal of the proximity filter are disposed so as not to be adjacent to an input terminal and an output terminal of the second filter.

Preferably, the proximity filter is the first filter, and the non-proximity filter is the third filter. The frequency of at least a portion of the first frequency band has a lower frequency than the second frequency band.

Preferably, the proximity filter is the third filter, and the non-proximity filter is the first filter. The frequency of at least a portion of the second frequency band has a lower frequency than the third frequency band.

Preferably, the non-proximity filter is disposed between the proximity filter and the second filter on the substrate.

Preferably, a distance between the input terminal of the proximity filter and the input terminal of the second filter on the substrate is larger than a distance between the input terminal of the proximity filter and an input terminal of the non-proximity filter and a distance between the input terminal of the second filter and the input terminal of the non-proximity filter.

Preferably, a distance between the output terminal of the proximity filter and the output terminal of the second filter on the substrate is larger than a distance between the output terminal of the proximity filter and an output terminal of the non-proximity filter and a distance between the output terminal of the second filter and the output terminal of the non-proximity filter.

Preferably, a ground terminal is not disposed between the input terminals of the first to third filters and/or between the output terminals of the first to third filters.

Preferably, the ground terminal is not disposed between the input terminals of the first to third filters and is not disposed between the output terminals of the first to third filters.

Preferably, each of the first to third filters is an elastic wave filter.

Preferably, each of the first to third filters is a surface acoustic wave filter.

Preferably, the input terminal of the non-proximity filter is electrically connected to the input terminal of the proximity filter or the input terminal of the second filter on the substrate, and is shared. The ground terminal is disposed between the output terminal of the non-proximity filter and the output terminal of the filter in which the input terminal is shared.

Preferably, the output terminal of the non-proximity filter is electrically connected to the output terminal of the proximity filter or the output terminal of the second filter on the substrate, and is shared. The ground terminal is disposed between the input terminal of the non-proximity filter and the input terminal of the filter in which the output terminal is shared.

A filter module according to a preferred embodiment of the present invention includes a filter device according to a preferred embodiment of the present invention and a mounting substrate in or on which the filter device is mounted. The input terminal of the non-proximity filter is electrically connected to the input terminal of the proximity filter or the input terminal of the second filter on the mounting substrate, and is shared. A ground terminal is disposed between the output terminal of the non-proximity filter and the output terminal of the filter in which the input terminal is shared, on the substrate of the filter device.

A filter module according to a preferred embodiment of the present invention includes a filter device according to a preferred embodiment of the present invention and a mounting substrate in or on which the filter device is mounted. The output terminal of the non-proximity filter is electrically connected to the output terminal of the proximity filter or the output terminal of the second filter on the mounting substrate, and is shared. A ground terminal is disposed between the input terminal of the non-proximity filter and the input terminal of the filter in which the output terminal is shared, on the substrate of the filter device.

According to preferred embodiments of the present invention, in filter devices in each of which a plurality of filters having different frequency bands are provided on the same substrate, deterioration in insertion loss characteristics of each filter is able to be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are diagrams for explaining a difference in configuration between a filter device according to a first preferred embodiment of the present invention and a filter device according to a comparative example.

DETAILED DESCRIPTION OF THE PREFERRED EMBODIMENTS

Figure 1:
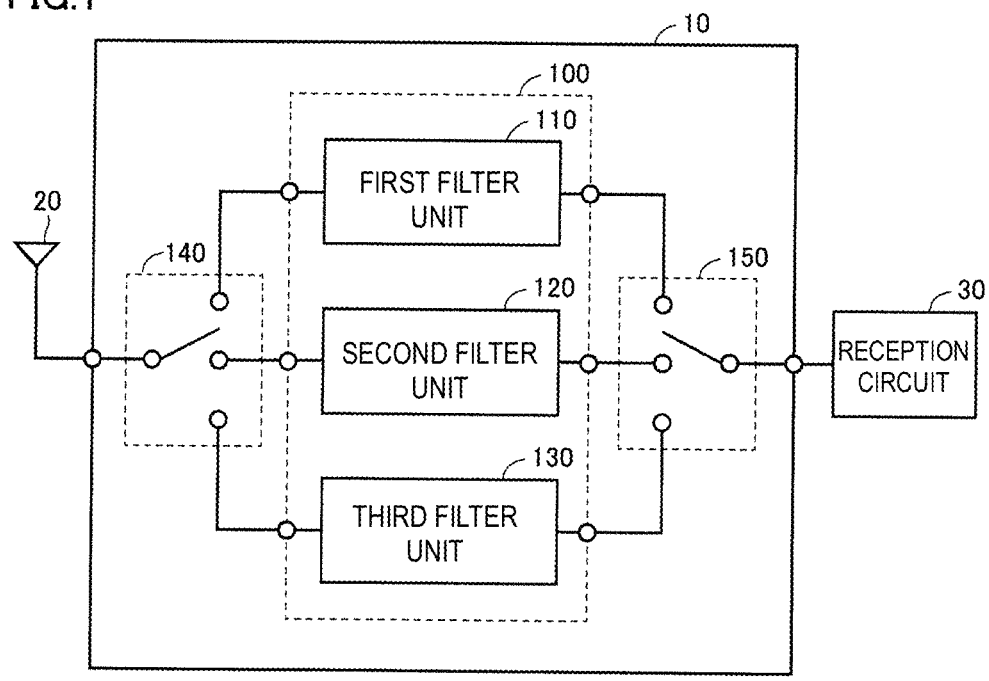
FIG. 1 is a diagram illustrating a schematic configuration of a filter device according to a preferred embodiment of the present invention.

Hereinafter, preferred embodiments of the present invention will be described in detail with reference to the accompanying drawings. The same or corresponding portions and elements in the figures are denoted by the same reference numerals, and the description thereof will not be repeated.

First Preferred Embodiment

FIG. 1 is a diagram illustrating a schematic configuration of a filter device 10 according to a first preferred embodiment of the present invention. Referring to FIG. 1, the filter device 10 is a triplexer including a first filter 110, a second filter 120, and a third filter 130 which are provided on a substrate 100. The first filter 110, the second filter 120, and the third filter 130 are connected in parallel between an antenna 20 and a reception circuit 30.

In addition, the filter device 10 further includes switches 140 and 150 selectively switching one of the first filter 110, the second filter 120, and the third filter 130.

In the filter device 10, each filter extracts a signal in a passable frequency band out of the radio frequency (RF) signals received from the antenna 20 and transmits the extracted signal to the reception circuit 30. For example, the passable frequency bands of the first filter 110, the second filter 120, and the third filter 130 are preferably equal to or more than about 2300 MHz and equal to or less than about 2370 MHz, equal to or more than about 2350 MHz and equal to or less than about 2360 MHz, and equal to or more than about 2620 MHz and equal to or less than about 2960 MHz, respectively.

Note that, instead of the switches 140 and 150, an input terminal of the filter other than the filter to be used may be connected to a ground potential, so that the radio frequency signal is selectively supplied to the filter.

Figure 2:
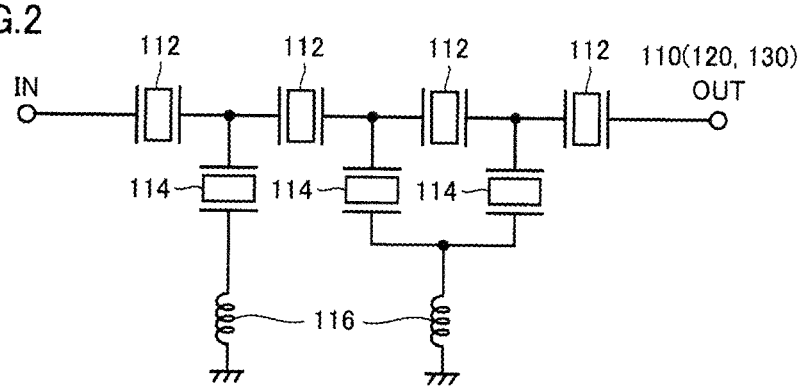
FIG. 2 is a diagram illustrating an example of a detailed configuration of each filter in FIG. 1.

FIG. 2 is a diagram illustrating an example of a detailed configuration of each filter illustrated in FIG. 1. In FIG. 2, the first filter 110 is described as an example, but the second filter 120 and the third filter 130 also have similar configurations.

The first filter 110 is preferably a ladder surface acoustic wave filter, for example, and includes a series arm resonator 112 connected in series to a series arm provided between an input terminal IN and an output terminal OUT, and a parallel arm resonator 114 provided in a parallel arm connected between the series arm and the ground potential. The parallel arm resonator 114 is connected to the ground potential with an inductor 116 interposed therebetween. In each filter, a passable frequency band is set by adjusting resonant frequencies of the series arm resonator and the parallel arm resonator and an inductance of the inductor.

In the present preferred embodiment, the surface acoustic wave (SAW) filter is used as the filter, but the filter may be an elastic wave filter other than the SAW filter.

Figure 3A:
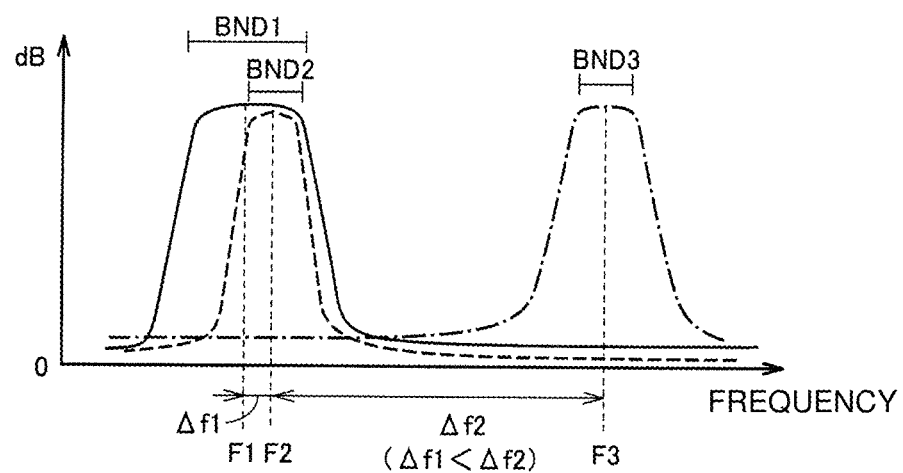
FIGS. 3A and 3B are diagrams for explaining a pass frequency band of each filter.
Figure 3B:
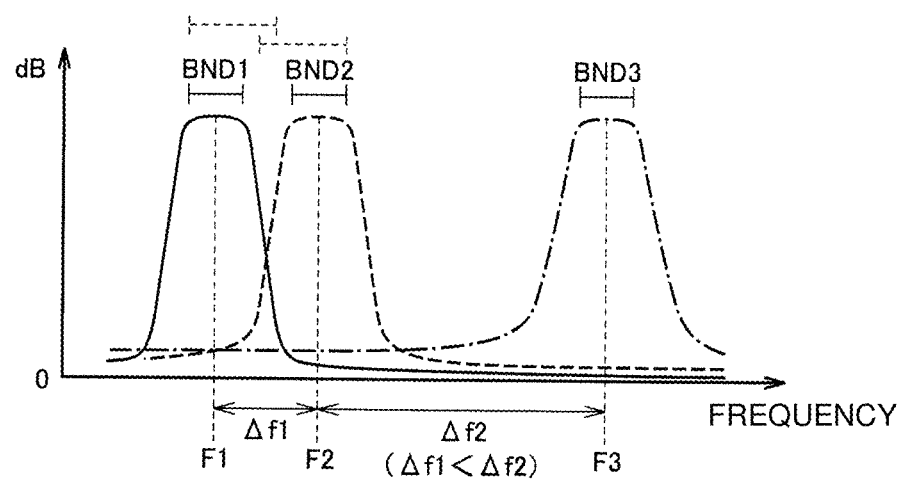

FIGS. 3A and 3B are diagrams for explaining a pass frequency band of each filter. In FIGS. 3A and 3B, the horizontal axis represents the frequency, and the vertical axis represents the intensity (signal level) of signal after passing through the filter as a dB value.

As described above, in the example of the first preferred embodiment, a pass frequency band BND1 of the first filter 110 is preferably equal to or more than about 2300 MHz and equal to or less than about 2370 MHz, a pass frequency band BND2 of the second filter 120 is equal to or more than about 2350 MHz and equal to or less than about 2360 MHz, and a pass frequency band BND3 of the third filter 130 is equal to or more than about 2620 MHz and equal to or less than about 2960 MHz. Therefore, as illustrated in FIG. 3A, the pass frequency band BND2 of the second filter 120 is included in the pass frequency band BND1 of the first filter 110. A center frequency F2 of the pass frequency band BND2 is between a center frequency F1 of the pass frequency band BND1 and a center frequency F3 of the pass frequency band BND3, and is set to be closer to the center frequency F1 of the pass frequency band BND1 than to the center frequency F3 of the pass frequency band BND3. That is, a difference $\Delta f1$ between the center frequency F1 and the center frequency F2 is smaller than a difference Δf2 between the center frequency F2 and the center frequency F3 (Δf1<Δf2).

Note that in the following description, as long as Δf1<Δf2 is satisfied, it is not limited to a case in which all of the pass frequency bands BND2 are included in the pass frequency band BND1 as illustrated in FIG. 3A. As illustrated in FIG. 3B, a case in which the pass frequency band BND2 and the pass frequency band BND1 do not overlap each other or a case in which only a portion of the pass frequency band BND2 overlaps the pass frequency band BND1 may be used.

In the first preferred embodiment, in order to reduce the size of the filter device 10, the three filters are provided on one substrate 100. As described above, in a case in which the pass frequency band BND1 and the pass frequency band BND2 are in proximity to each other (partially overlapped), when signal terminals (input/output terminals) of these filters are adjacent to each other on the substrate 100, the terminals are electromagnetically coupled to each other, so that isolation between the terminals may not be sufficiently ensured. Then, the passing signals interfere with each other, so that attenuation characteristics of each of the filters may deteriorate, or the loss may increase.

In order to prevent such interference of signals, it is possible to provide a ground terminal between the respective signal terminals, but when the ground terminals are provided between all terminals, the size of the device becomes large, and the purpose of reducing the size of the device cannot be achieved.

Therefore, in the first preferred embodiment, of the three filters having frequency bands different from each other, the filter having an intermediate center frequency (second filter 120 in the first preferred embodiment) and the filter having the pass frequency band in proximity (first filter 110 in the first preferred embodiment; also referred to as "proximity filter") are arranged such that the mutual input/output terminals are not adjacent to each other, thus reducing or preventing interference between the input/output signals. Further, as for the filter having the pass frequency band farther away (third filter 130 in the first preferred embodiment: also referred to as "non-proximity filter"), at least one signal terminal is disposed adjacent to the signal terminal of the second filter 120 (i.e., the ground terminal is not disposed between the signal terminals), thus reducing or preventing the size of the device from becoming large.

The details will be described with reference to FIGS. 4A and 4B. FIGS. 4A and 4B are diagrams for explaining a difference in configuration between a filter device according to the first preferred embodiment (FIG. 4A) and a filter device (FIG. 4B) according to a comparative example.

In the filter device according to the first preferred embodiment illustrated in the FIG. 4A, on the substrate 100, the third filter 130 having the pass frequency band farther away from those of the first filter 110 and the second filter 120 is disposed between the two filters having the pass frequency bands in proximity to each other. As such, an input terminal IN1 of the first filter 110 and an input terminal IN2 of the second filter 120 are not adjacent to each other, and an output terminal OUT1 of the first filter 110 and an output terminal OUT2 of the second filter 120 are not adjacent to each other. Since at least the input terminal and the output terminal of the third filter 130 are respectively disposed between the input terminals and between the output terminals, an isolation distance between the terminals of the first filter 110 and the second filter 120 is able to be ensured.

In addition, in the case of the FIG. 4A, a ground terminal GND is provided between the input terminal IN2 of the second filter 120 and an input terminal IN3 of the third filter 130, and the ground terminal GND is provided between the output terminal OUT1 of the first filter 110 and an output terminal OUT3 of the third filter 130. Therefore, the isolation between the terminals of the first filter 110 and the second filter 120 is able to be easily ensured.

Note that in FIG. 4A, an input/output terminal of the third filter 130, which is the non-proximity filter, is arranged such that at least one input/output terminal is adjacent to the input/output terminal of the first filter 110 or the second filter 120. Specifically, in FIG. 4A, the input terminal IN1 of the first filter 110 and the input terminal IN3 of the third filter 130 are adjacent to each other, and the output terminal OUT2 of the second filter 120 and the output terminal OUT3 of the third filter 130 are adjacent to each other.

In other words, the following relationship between the input terminals and between the output terminals of the filters is established in which, on the substrate 100, a distance between the terminal of the first filter (proximity filter) 110 and the terminal of the second filter 120 is larger than a distance between the terminal of the first filter 110 and the terminal of the third filter (non-proximity filter) 130 and a distance between the terminal of the second filter 120 and the terminal of the third filter 130.

Since the input/output terminals between the filters having the pass frequency bands farther away from each other are hardly interfered by a signal with each other, the influence on the attenuation characteristics is small even when being arranged adjacent to each other. In this manner, by disposing no ground terminal GND between terminals causing little or no influence on the attenuation characteristics, the device size is able to be reduced while maintaining isolation between terminals. Note that in the example illustrated in FIG. 4A, the ground terminal GND is provided between the input terminal IN2 of the second filter 120 and the input terminal IN3 of the third filter 130, and another ground terminal GND between the output terminal OUT1 of the first filter 110 and the output terminal OUT3 of the third filter 130, but the ground terminal GND may be omitted.

On the other hand, in the comparative example of FIG. 4B, the second filter 120 is disposed between the first filter 110 and the third filter 130. That is, the first filter 110 and the second filter 120, which have the pass frequency bands in proximity to each other, are disposed in proximity to each other. Therefore, as in FIG. 4B, in a case in which the input/output terminal of the second filter 120 is adjacent to the input/output terminal of another proximity filter without interposing the ground terminal GND therebetween, the input/output terminals of the first filter 110 and the second filter 120 are adjacent to each other, so that isolation between these terminals is not ensured (in FIG. 4B, input terminal IN1 of the first filter 110 and input terminal IN2 of the second filter 120).

Figure 5:
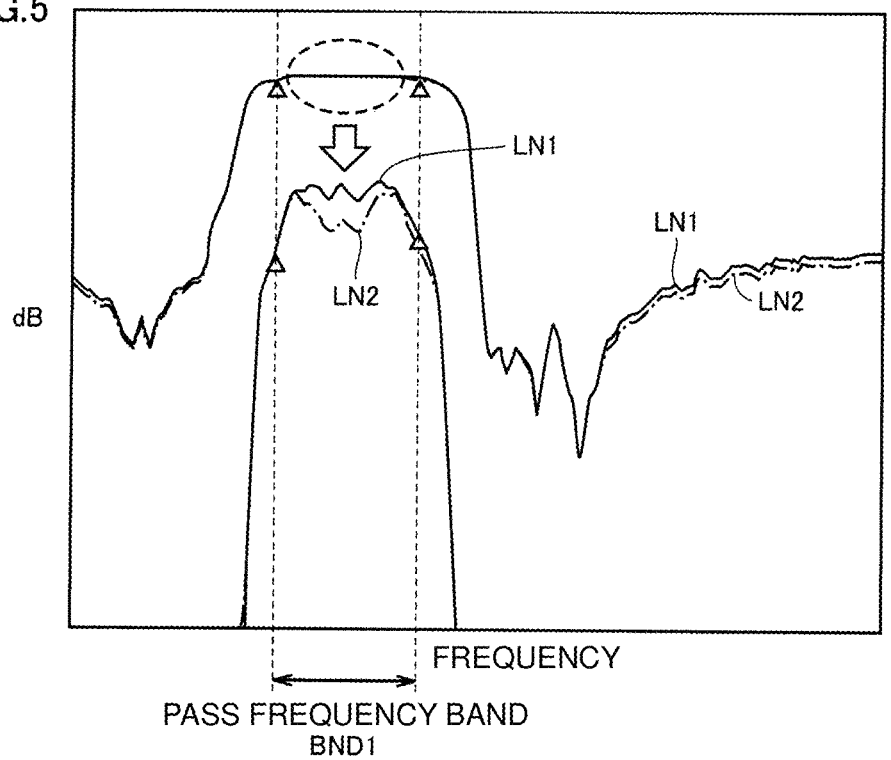
FIG. 5 is a diagram for explaining a difference in frequency characteristics of first filters in the example illustrated in FIGS. 4A and 4B.

FIG. 5 is a diagram illustrating filter characteristics for explaining a difference in frequency characteristics of the first filter 110 in the example illustrated in FIGS. 4A and 4B. In FIG. 5, the horizontal axis represents the frequency, and the vertical axis represents the intensity of the output signal of the first filter 110 as the dB value. In FIG. 5, a line LN1 represents the case of the first preferred embodiment illustrated in FIG. 4A, and a line LN2 represents the case of the comparative example illustrated in FIG. 4B. Note that in order to further clarify the difference between FIGS. 4A and 4B, a portion in the vicinity of the pass frequency band BND1 of the first filter 110 in the graph is also illustrated by enlarging the scale on the vertical axis.

Referring to FIG. 5, it can be seen that in the line LN2 corresponding to the comparative example, the signal level is lower than that of the line LN1 corresponding to the first preferred embodiment within the pass frequency band BND1. In other words, as in the first preferred embodiment, by providing the arrangement in which the input/output terminals of the first filter 110 and the second filter 120 having pass frequency bands in proximity to each other are not adjacent to each other, it is possible to reduce the deterioration of insertion loss characteristics of the passing signal.

Figure 6:
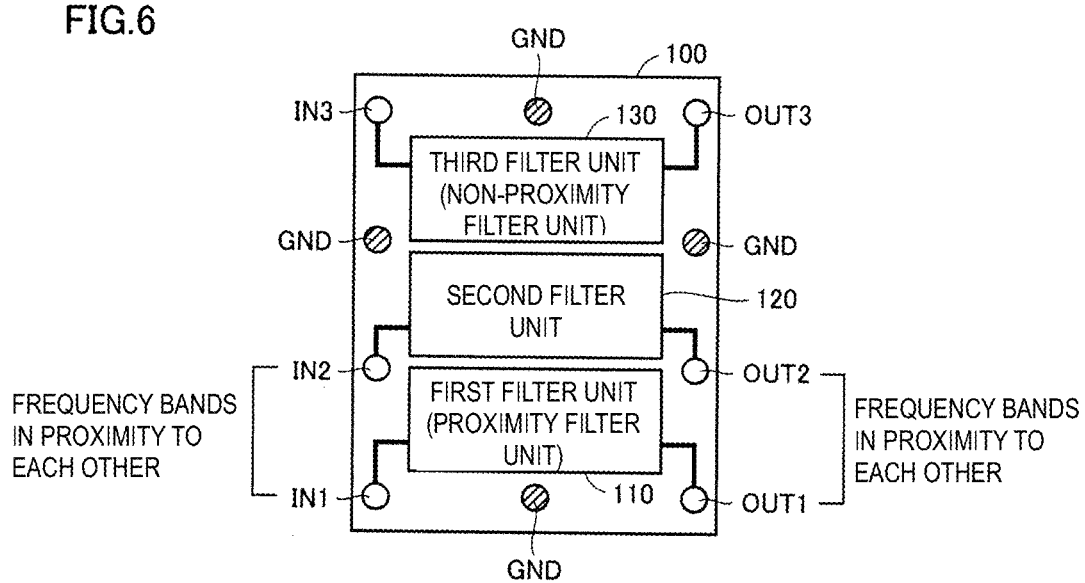
FIG. 6 is a diagram for explaining a configuration in another comparative example.

FIG. 6 is a diagram for explaining a configuration in another comparative example. In FIG. 6, as compared to the case of FIG. 4B, the output terminal OUT2 of the second filter 120 is adjacent to the output terminal OUT1 of the first filter 110, which is the proximity filter. Also in such a comparative example, the input/output terminals of two filters having the pass frequency bands in proximity to each other are adjacent to each other, so that the frequency characteristics of the first filter 110 are deteriorated.

Figure 7:
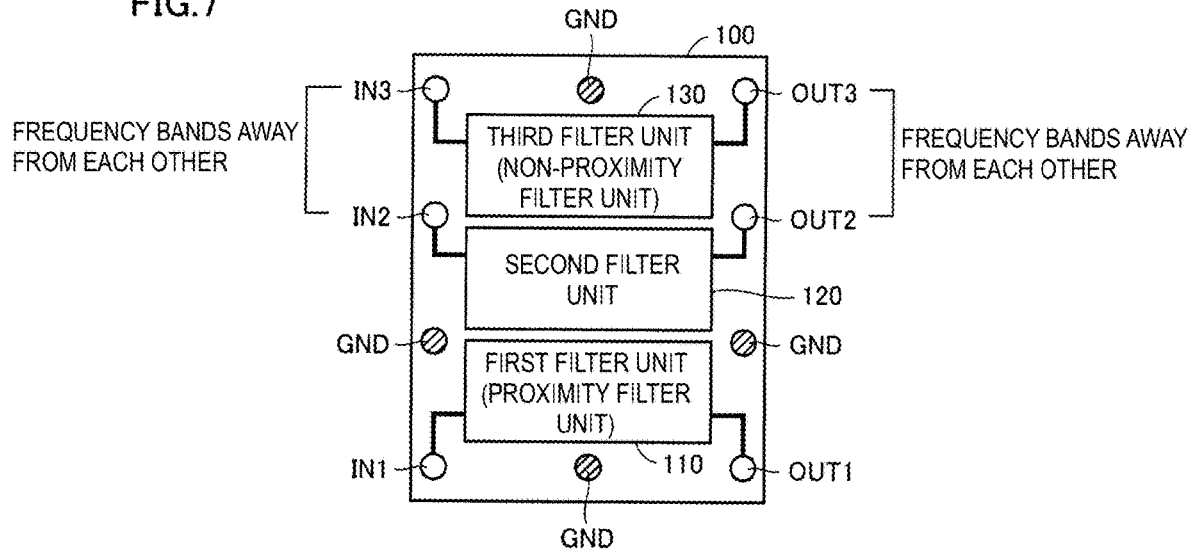
FIG. 7 is a diagram illustrating another example of the configuration of the filter device according to the first preferred embodiment of the present invention.

FIG. 7 is a diagram illustrating another example of the configuration of the filter device according to the first preferred embodiment. In FIG. 7, the input terminal IN3 of the third filter 130 is in proximity to the input terminal IN2 of the second filter 120, and the output terminal OUT3 of the third filter 130 is in proximity to the output terminal OUT2 of the second filter 120. Even in such a case, it is possible to reduce or prevent an increase in the size of the device while ensuring isolation between the first filter 110 and the second filter 120 having the pass frequency bands in proximity to each other.

Second Preferred Embodiment

In the first preferred embodiment, the case in which the received radio frequency signal is supplied to only the filter having the frequency band to be used of three filters has been described.

On the other hand, in recent years, carrier aggregation in which a plurality of frequency bands (lines) are simultaneously used is becoming widespread in order to increase the speed of communication. In this case, since the radio frequency signal is supplied to a plurality of filters having different frequency bands at the same time, a plurality of filters may be connected to a common antenna.

Then, since the signals that have passed through each of the filters appear at the output terminals of two filters, in a case in which the output terminals are adjacent to each other, the output signals may interfere with each other due to the electromagnetic field coupling between the terminals even when the frequency bands are not in proximity to each other.

Therefore, in a second preferred embodiment, in a case in which the input terminals of two filters are common to each other for the carrier aggregation, the ground terminal is provided between the output terminals of the two filters which are common to each other, so that the output signals of the filters are prevented from interfering with each other.

Figure 8:
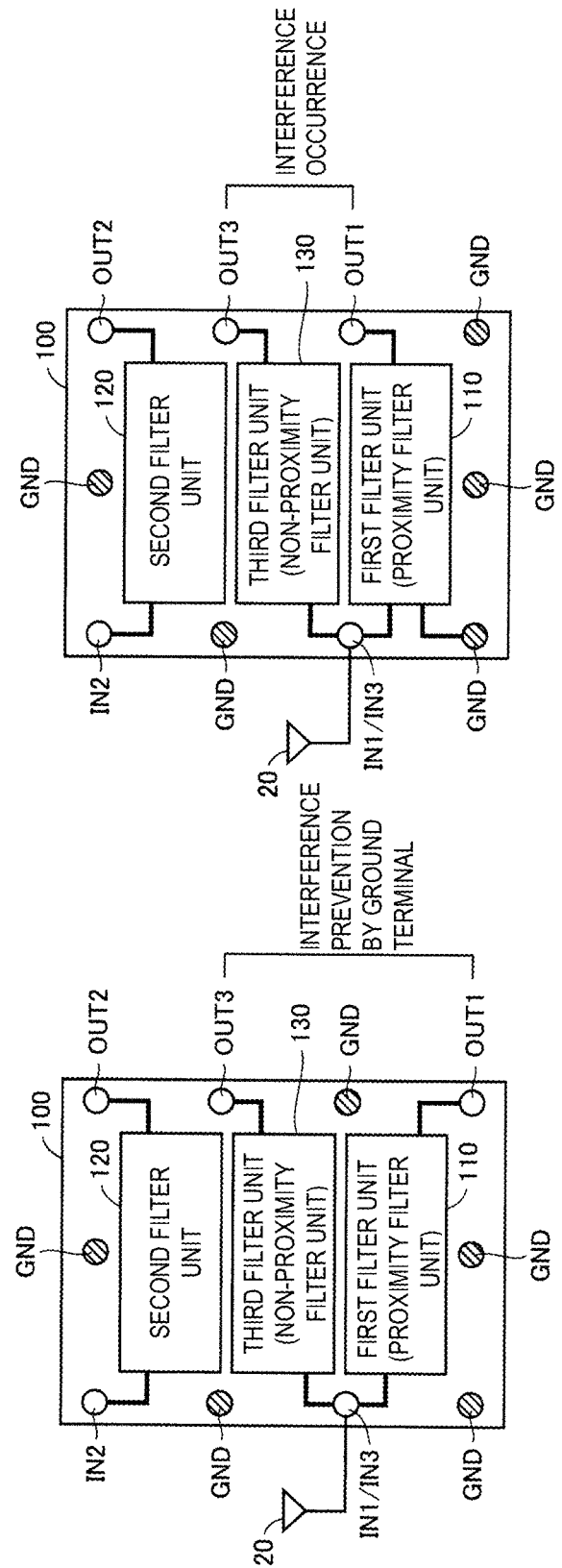
FIGS. 8A and 8B are diagrams for explaining a difference in configuration between a filter device according to a second preferred embodiment of the present invention and a filter device according to a comparative example.

FIGS. 8A and 8B is a diagram for explaining a difference in configuration between a filter device according to the second preferred embodiment (FIG. 8A) and a filter device according to a comparative example (FIG. 8B).

Referring to FIGS. 8A and 8B, FIG. 8A, as in FIG. 4A of the first preferred embodiment, the third filter 130, which is the non-proximity filter, is disposed between the first filter 110 and the second filter 120. The input terminal IN1 of the first filter 110 and the input terminal IN3 of the third filter 130 are common to the same terminal on the substrate 100, and the antenna 20 is connected to the terminal.

On the other hand, the ground terminal is provided between the output terminal OUT1 of the first filter 110 and the output terminal OUT3 of the third filter 130, so that isolation between the output terminals is ensured.

In the FIG. 8B of the comparative example, the output terminal OUT1 of the first filter 110 and the output terminal OUT3 of the third filter 130 are adjacent to each other.

Figure 9:
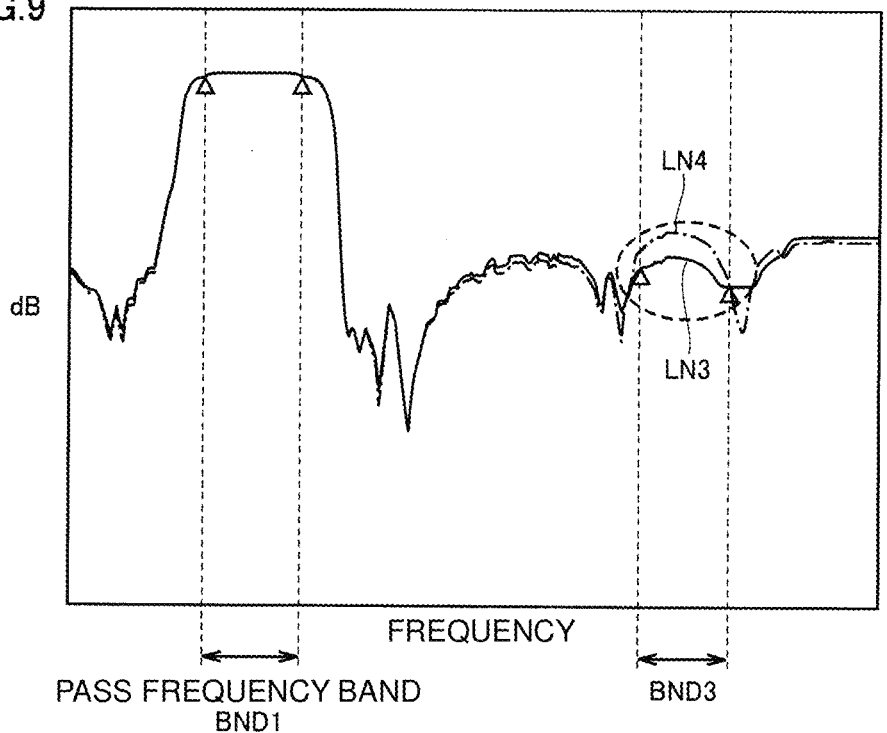
FIG. 9 is a diagram for explaining a difference in frequency characteristics of first filters in the example illustrated in FIGS. 8A and 8B.

FIG. 9 is a diagram for explaining a difference in frequency characteristics of the first filter 110 in the example illustrated in FIGS. 8A and 8B. In FIG. 9, the horizontal axis represents the frequency, and the vertical axis represents the intensity of the output signal of the first filter 110 as the dB value. In addition, in FIG. 9, a line LN3 represents the case of the second preferred embodiment illustrated in FIG. 8A, and a line LN4 represents the case of the comparative example illustrated in FIG. 8B.

As can be seen from FIG. 9, in the line LN4 in the case in which the output terminal OUT1 and the output terminal OUT3 are adjacent to each other as compared with the line LN3 in the case in which the ground terminal GND is disposed between the output terminal OUT1 and the output terminal OUT3, the signal intensity in the vicinity of the pass frequency band BND3 of the third filter 130 is increased. That is, the output of the first filter 110 is affected by the output signal of the third filter 130, so that the attenuation characteristics in the vicinity of the pass frequency band BND3 are deteriorated.

Although not illustrated in FIG. 9, in the frequency characteristics of the third filter 130, the signal intensity in the vicinity of the pass frequency band BND1 of the first filter 110 becomes large, and the output signal of the first filter 110 affects the output signal of the third filter 130.

In this manner, in a case in which the input terminals of two filters are common to each other for carrier aggregation, the ground terminal is disposed between the output terminals of the two filters which are shared, thus reducing the interference of the signals between the output terminals. This makes it possible to reduce or prevent deterioration in the attenuation characteristics of each filter.

Figure 10:
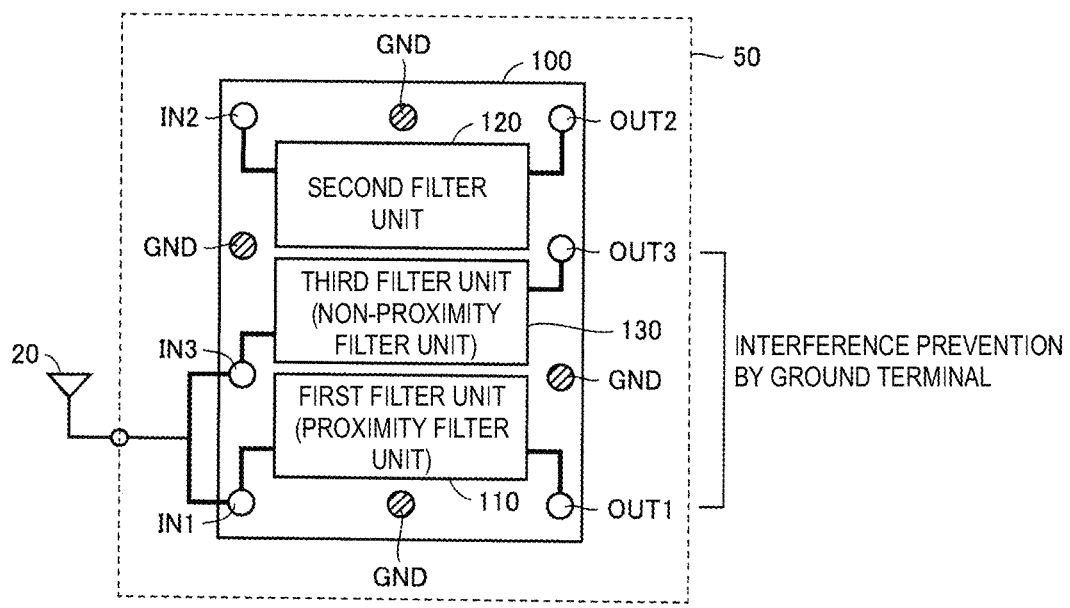
FIG. 10 is a diagram illustrating a modification of the second preferred embodiment of the present invention.

Although FIGS. 8A and 8B illustrate the examples of the configuration in which the input terminal IN1 and the input terminal IN3 are common to the same terminal on the substrate 100, a configuration may be provided in which the input terminal IN1 and the input terminal IN3 are electrically connected on a mounting substrate 50 in a filter module in which the substrate 100 of the filter device 10 is mounted in or on the mounting substrate 50 as illustrated in FIG. 10.

Figure 11:
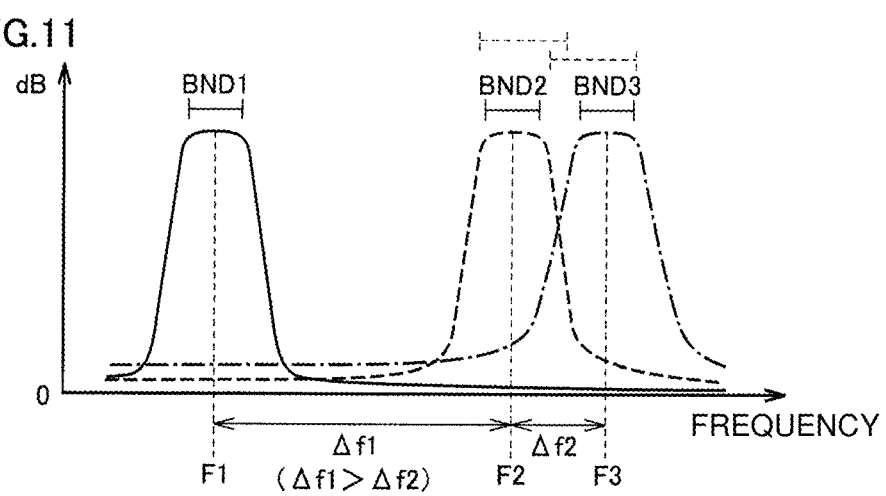
FIG. 11 is a diagram for explaining another example of the pass band of each filter.

In the preferred embodiments described above, the case has been described in which the pass frequency band BND2 of the second filter 120 is in proximity to the pass frequency band BND1 of the first filter 110, that is, the proximity filter is the first filter 110, and the non-proximity filter is the third filter 130. However, the configuration described above is also applicable to a case in which the proximity filter and the non-proximity filter are inversely arranged as illustrated in FIG. 11, that is, a case in which the pass frequency band BND2 of the second filter 120 is in proximity to the pass frequency band BND3 of the third filter 130. In this case, the first filter 110, which is the non-proximity filter, is disposed between the second filter 120 and the third filter 130.

In the preferred embodiments described above, an example including three filters is described, but even in a case in which four or more filters are provided on one substrates, the preferred embodiments may also be applied to the arrangement between three filters of the four or more filters.

Further, in the preferred embodiments described above, an example in which the radio frequency signal is received has been described. However, preferred embodiments of the present invention are also applicable to an example in which the radio frequency signal is transmitted. In this case, the input terminal in each of the figures defines and functions as an output terminal, and the output terminal defines and functions as an input terminal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a substrate; and
   first, second, and third filters provided on the substrate and each including an input terminal and an output terminal; wherein
   the first, second, and third filters are structured to pass signals in first, second, and third frequency bands, respectively, and a center frequency of the first frequency band is lower than a center frequency of the second frequency band, and the center frequency of the second frequency band is lower than a center frequency of the third frequency band;
   of the first and third filters, when one of the first and third filters having a frequency band in which a center frequency of a passable frequency band is closer to the center frequency of the second frequency band is defined as a proximity filter and the other of the first and the third filters is defined as a non-proximity filter,
   an input terminal and an output terminal of the proximity filter are not adjacent to an input terminal and an output terminal of the second filter;
   an input terminal of the non-proximity filter is electrically connected to the input terminal of the proximity filter or the input terminal of the second filter and is shared; and
   a ground terminal is disposed between an output terminal of the non-proximity filter and the output terminal of the proximity filter or the second filter in which the input terminal is shared.

2. The filter device according to claim 1, wherein
   the proximity filter is the first filter, and the non-proximity filter is the third filter; and
   a frequency of at least a portion of the first frequency band has a lower frequency than the second frequency band.

3. The filter device according to claim 1, wherein
   the proximity filter is the third filter and the non-proximity filter is the first filter; and
   a frequency of at least a portion of the second frequency band has a lower frequency than the third frequency band.

4. The filter device according to claim 1, wherein the non-proximity filter is disposed between the proximity filter and the second filter on the substrate.

5. A filter module comprising:
   the filter device according to claim 1; and
   a mounting substrate in or on which the filter device is mounted; wherein
   the input terminal of the non-proximity filter is electrically connected to the input terminal of the proximity filter or the input terminal of the second filter on the mounting substrate.

6. The filter module according to claim 5, wherein each of the first, second, and third filters is an elastic wave filter.

7. The filter module according to claim 5, wherein the non-proximity filter is disposed between the proximity filter and the second filter on the substrate.

8. The filter module according to claim 5, wherein
   the proximity filter is the first filter, and the non-proximity filter is the third filter; and
   a frequency of at least a portion of the first frequency band has a lower frequency than the second frequency band.

9. The filter device according to claim 1, wherein each of the first, second, and third filters is an elastic wave filter.

10. The filter device according to claim 9, wherein each of the first, second, and third filters is a surface acoustic wave filter.

11. The filter device according to claim 1, wherein
    the input terminal of the non-proximity filter is electrically connected to the input terminal of the proximity filter or the input terminal of the second filter on the substrate.

12. The filter device according to claim 1, wherein on the substrate, a distance between the output terminal of the proximity filter and the output terminal of the second filter is larger than a distance between the output terminal of the proximity filter and the output terminal of the non-proximity filter, and a distance between the output terminal of the second filter and the output terminal of the non-proximity filter.

13. The filter device according to claim 1, wherein no ground terminal is disposed between the input terminals of the second filter and the non-proximity filter and/or between the output terminals of the second filter and the non-proximity filter.

14. A filter device comprising:
    a substrate; and
    first, second, and third filters provided on the substrate and each including an input terminal and an output terminal; wherein
    the first, second, and third filters are structured to pass signals in first, second, and third frequency bands, respectively, and a center frequency of the first frequency band is lower than a center frequency of the second frequency band, and the center frequency of the second frequency band is lower than a center frequency of the third frequency band;
    of the first and third filters, when one of the first and third filters having a frequency band in which a center frequency of a passable frequency band is closer to the center frequency of the second frequency band is defined as a proximity filter and the other of the first and third filters is defined as a non-proximity filter,
    an input terminal and an output terminal of the proximity filter are not adjacent to an input terminal and an output terminal of the second filter;
    an output terminal of the non-proximity filter is electrically connected to the output terminal of the proximity filter or the output terminal of the second filter and is shared; and
    a ground terminal is disposed between an input terminal of the non-proximity filter and the input terminal of the proximity filter or the second filter in which the output terminal is shared.

15. The filter device according to claim 14, wherein on the substrate, a distance between the input terminal of the proximity filter and the input terminal of the second filter is larger than a distance between the input terminal of the proximity filter and the input terminal of the non-proximity filter and a distance between the input terminal of the second filter and the input terminal of the non-proximity filter.

16. The filter device according to claim 14, wherein no ground terminal is disposed between either of the input terminals of the second filter and the non-proximity filter and/or the output terminals of the second filter and the non-proximity filter.

17. A filter module comprising:
the filter device according to claim 14; and
a mounting substrate in or on which the filter device is mounted; wherein
the output terminal of the non-proximity filter is electrically connected to the output terminal of the proximity filter or the output terminal of the second filter on the mounting substrate.

18. The filter module according to claim 17, wherein
the proximity filter is the first filter, and the non-proximity filter is the third filter; and
a frequency of at least a portion of the first frequency band has a lower frequency than the second frequency band.

19. The filter module according to claim 17, wherein the non-proximity filter is disposed between the proximity filter and the second filter on the substrate.

20. The filter module according to claim 17, wherein each of the first, second, and third filters is an elastic wave filter.

21. The filter device according to claim 14, wherein
the output terminal of the non-proximity filter is electrically connected to the output terminal of the proximity filter or the output terminal of the second filter on the substrate.

* * * * *